(12) United States Patent
Okako et al.

(10) Patent No.: US 7,149,481 B2
(45) Date of Patent: Dec. 12, 2006

(54) CARD-TYPE WIRELESS COMMUNICATION DEVICE

(75) Inventors: Norikazu Okako, Chuo-ku (JP); Minoru Shioi, Chuo-ku (JP)

(73) Assignee: TDK Corporation, Tokyo (JP)

( * ) Notice: Subject to any disclaimer, the term of this patent is extended or adjusted under 35 U.S.C. 154(b) by 760 days.

(21) Appl. No.: 10/455,347

(22) Filed: Jun. 6, 2003

(65) Prior Publication Data

US 2004/0014507 A1 Jan. 22, 2004

(30) Foreign Application Priority Data

Jul. 22, 2002 (JP) ............................. 2002-212455

(51) Int. Cl.
*H04B 1/38* (2006.01)
(52) U.S. Cl. .................... 455/90.3; 455/575.1; 361/816
(58) Field of Classification Search ............... 455/93.3, 455/575.1–575.8; 361/816
See application file for complete search history.

(56) References Cited

U.S. PATENT DOCUMENTS

| | | | | |
|---|---|---|---|---|
| 5,422,433 A | * | 6/1995 | Rivera et al. | 174/382 |
| 5,764,492 A | * | 6/1998 | Ady et al. | 361/818 |
| 5,847,938 A | * | 12/1998 | Gammon | 361/816 |
| 6,122,178 A | * | 9/2000 | Andrews et al. | 361/800 |
| 6,138,347 A | * | 10/2000 | Persson et al. | 29/836 |
| 6,157,546 A | * | 12/2000 | Petty et al. | 361/816 |
| 6,271,465 B1 | * | 8/2001 | Lacey | 174/358 |
| 6,272,349 B1 | * | 8/2001 | McGrath et al. | 455/456.3 |
| 6,624,432 B1 | * | 9/2003 | Gabower et al. | 250/515.1 |
| 6,738,265 B1 | * | 5/2004 | Svarfvar et al. | 361/818 |

FOREIGN PATENT DOCUMENTS

| | | |
|---|---|---|
| JP | A 05-136591 | 6/1993 |
| JP | A 11-261274 | 9/1999 |
| JP | A 2002-94260 | 3/2002 |

* cited by examiner

*Primary Examiner*—Fan Tsang
*Assistant Examiner*—Simon Sing
(74) *Attorney, Agent, or Firm*—Oliff & Berridge, PLC

(57) ABSTRACT

There is provided a PC card-type wireless LAN card including a metal cover in which lowering of throughput of data transmission is prevented. In a card-type wireless communication device (wireless LAN card) in which a printed board assembly including an antenna, an RF (radio frequency) circuit part (wireless circuit part), a baseband circuit part, and a connector for connection with an information terminal device is fixed to a frame made of synthetic resin, and is covered with a top cover made of metal and a bottom cover except for the portion of the antenna, a shield case made of metal covering the RF circuit part and electrically connected to a ground pattern and the top cover made of metal are brought into contact with each other in a wide range through a metal conductor worked into a shape having elasticity.

4 Claims, 5 Drawing Sheets

CARD-TYPE WIRELESS COMMUNICATION DEVICE

BACKGROUND OF THE INVENTION

1. Field of the Invention

The present invention relates to a card-type wireless communication device mounted in an information terminal device such as a PC (Personal Computer), for constructing a wireless LAN.

2. Description of the Related Art

In recent years, data communication via a wireless LAN (Local Area Network) typified by, for example, standards of IEEE802.11 series is becoming common. In the wireless LAN, a wireless network using an electric wave is constructed, and data transmission/reception between PCs or a PC and a peripheral device such as a printer can be carried out.

For example, in IEEE802.11b, an electric wave of a 2.4 GHz band is used, and a wireless network having a data transfer rate of about 10 Mbps almost equal to that of a low speed wired LAN can be constructed in the range of a distance of about 10 m to 100 m. In the IEEE802.11b, wireless communication by a direct sequence spectrum spread (DS-SS) as one of spectrum spread systems is adopted to prevent mixing of noise or tapping.

As a communication mode, there is an ad hoc system in which data transmission/reception is directly performed between transmission and reception devices, or an infrastructure system in which an access point is provided and data transmission/reception is performed through the access point. In order to realize the wireless LAN, a wireless LAN card or an adapter is mounted in each PC and peripheral device, and an access point is installed as the need arises.

Besides, recently, a wireless LAN card based on IEEE802.11a is going into actual use. This wireless LAN system uses a 5 GHz band and adopts an OFDM modulation system (Orthogonal Frequency Division Multiplex modulation system), so that a maximum transmission rate of 54 Mbps is realized.

FIG. 4 shows a longitudinal section of a conventional wireless LAN card of PCMCIA standards. FIG. 5 is a plan view of a printed board assembly of the conventional wireless LAN card. As shown in FIG. 4, in a conventional wireless LAN card 100, a printed board assembly 120 is attached to a frame 101 made of synthetic resin, and an upper surface and a lower surface of the printed board assembly 120 are covered with a top cover 102 and a bottom cover 103 which are made of metal.

As shown in FIG. 5, the printed board assembly 120 is structured such that a connector 122, a baseband circuit part 123, an RF (radio frequency) circuit part (wireless circuit part) 124 and two antennas 125 are disposed on a printed board 121. The connector 122 for connection with a not-shown information terminal device is attached to one end side of the substantially rectangular printed board 121 in the longitudinal direction. The diversity antennas 125 are disposed at the other end side of the printed board 121 in the longitudinal direction. The baseband circuit part 123 is disposed at the side of the connector 122. The RF circuit part 124 is provided at the side of the antennas 125. The RF circuit part 124 is covered with a shield case 126. A leg part of the shield case 126 is connected to a ground pattern (not shown) formed on the printed board 121 by soldering.

The wireless LAN can be constructed by mounting the wireless LAN card 100 in a card slot of an information terminal device such as a PC. In the state where the wireless LAN card 100 is mounted in the card slot, the portion of the antennas 125 protrudes outward. Since the portion of the antennas 125 is covered with the frame 101 made of synthetic resin, sending or receiving of an electric wave can be performed through one of the antennas 125. The baseband circuit part 123 is provided at a position remote from the antennas 125 in order to prevent a digital noise or the like generated in the baseband circuit part 123 from being mixed into the portion of the antennas 125. Further, since the RF circuit part 124 is covered with the shield case 126, it is possible to prevent a RF signal from leaking out and to prevent an external noise or the like from being mixed into the RF circuit part 124.

However, it has been found that when the wireless LAN card 100 having the structure shown in FIGS. 4 and 5 is mounted in each of plural personal computers and peripheral devices to construct a wireless LAN, and throughput of data transmission (data transmission amount per unit time) is measured, there is a case where the throughput is lowered.

SUMMARY OF THE INVENTION

The present invention has been made to solve the problem, and an object thereof is to provide a card-type wireless communication device capable of stably performing wireless data transmission.

The above object is achieved by a card-type wireless communication device comprising a printed board assembly including an antenna part, a radio frequency circuit part, a baseband circuit part, a connector to be connected to an information terminal device, and a metal shield case covering the radio frequency circuit part and electrically connected to a ground pattern, a metal cover covering the printed board assembly except for the antenna part, and a metal conductor disposed in a gap between the shield case and the metal cover and worked into a shape having elasticity to bring the shield case into contact with the metal cover.

In the above card-type wireless communication device of the invention, the metal conductor has a plane shape and is in plane contact with the shield case and the metal cover.

Besides, in the above card-type wireless communication device of the invention, a surface of the metal conductor is subjected to a treatment to resist oxidation and corrosion.

Further, in the above card-type wireless communication device of the invention, a frequency of a radio signal sending or receiving by the antenna is in a 5 GHz band.

It has been experimentally confirmed that by bringing the shield case covering the RF circuit part into contact with the metal cover in a wide range through the metal conductor worked into the shape having the elasticity, sending or receiving of radio data is satisfactorily performed and the throughput is improved. Besides, the card-type wireless communication device of the invention was connected to plural types of personal computers and experiments were carried out, and as a result, the throughput of wireless data transmission was not lowered in any types.

DETAILED DESCRIPTION OF THE PREFERRED EMBODIMENTS

Figure 1:
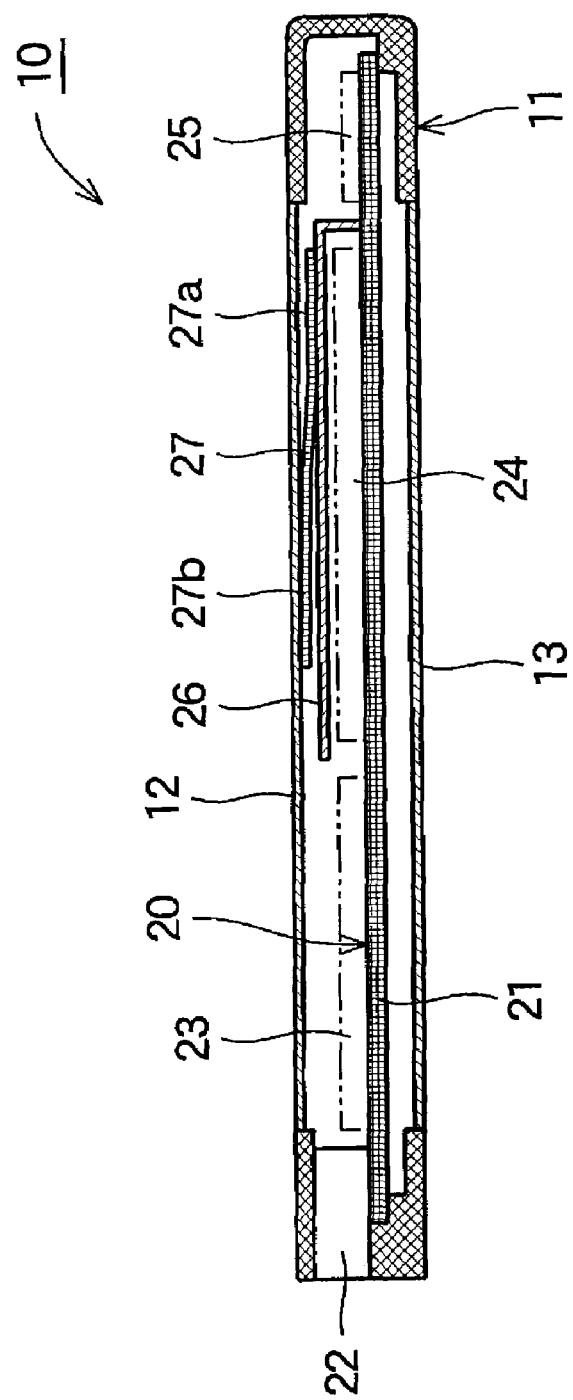
FIG. 1 is a vertical sectional view of a wireless LAN card as a card-type wireless communication device according to an embodiment of the invention.

A card-type wireless communication device according to an embodiment of the invention will be described with reference to FIGS. 1 to 3. First, a rough structure of the card-type wireless communication device according to this embodiment will be described with reference to FIG. 1. FIG. 1 is a vertical sectional view of a wireless LAN card as an example of the card-type wireless communication device according to the embodiment.

A wireless LAN card 10 shown in FIG. 1 is based on the wireless LAN system IEEE802.1a, and specifically, uses a 5 GHz band and adopts an OFDM modulation system (Orthogonal Frequency Division Multiplex modulation system), so that it supports a maximum transmission rate of 54 Mbps. Besides, this wireless LAN card 10 has a shape and connector structure based on a PCMCIA standard.

In the wireless LAN card 10, a printed board assembly 20 is attached to a frame 11 made of synthetic resin, and its upper surface and lower surface are covered with a top cover 12 and a bottom cover 13 which are made of metal.

In the printed board assembly 20, a connector 22, a baseband circuit part 23, an RF circuit part (wireless circuit part) 24 and two antennas 25 are disposed on a printed board 21. The connector 22 for connection with a not-shown information terminal device is attached to one end side (left end side in the drawing) of the substantially rectangular printed board 21 in the longitudinal direction. The diversity antennas 25 are provided at the other end side (right end side in the drawing) of the printed board 21 in the longitudinal direction. The baseband circuit part 23 is provided at the side of the connector 22. The RF circuit part 24 is provided at the side of the antennas 25. The RF circuit part 24 is covered with a shield case 26. A leg part of the shield case 26 is connected to a ground pattern (not shown) formed on the printed board 21 by soldering.

A metal conductor 27 worked into a shape having elasticity is disposed in a gap between the upper surface of the shield case 26 and the lower surface of the top cover 12, and the shield case 26 and the top cover 12 are electrically connected to each other through the metal conductor 27. The metal conductor 27 is formed by crookedly bending a thin plate member made of, for example, phosphor bronze or stainless and resistant to oxidation and corrosion. The thickness of the thin plate member is formed to be sufficiently thinner than the gap between the shield case 26 and the top cover 12. A base end part 27a side of the metal conductor 27 is fixed to the upper surface of the shield case 26 by, for example, spot welding. In the state where the top cover 12 is attached, a tip end 27b side of the metal conductor 27 is brought into contact with and pressed to the lower surface of the top cover 12, and a wide range of the tip end 27b side of the metal conductor 27 comes in contact with the lower surface of the top cover 12.

Figure 2:
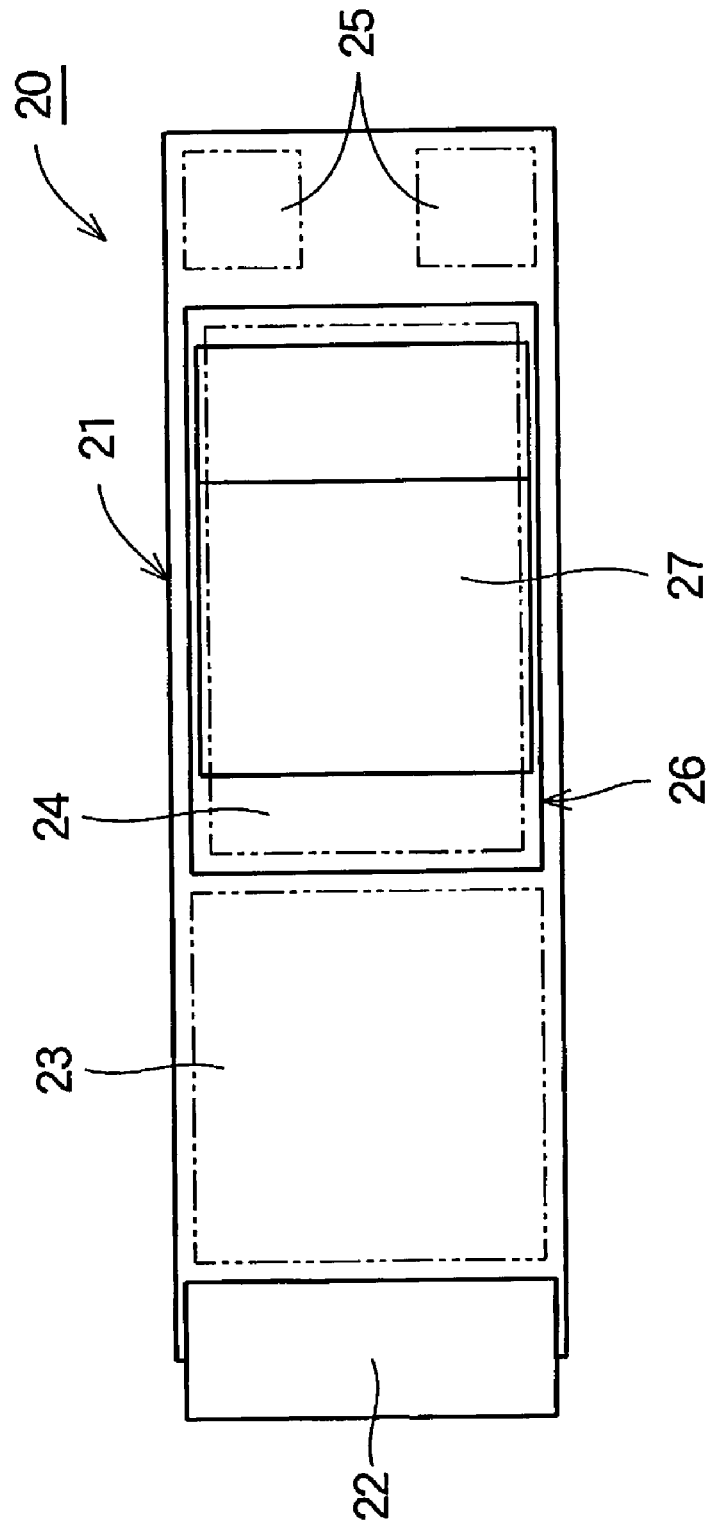
FIG. 2 is a plan view of a printed board assembly of the wireless LAN card as the card-type wireless communication device according to the embodiment of the invention.

FIG. 2 is a plan view of the printed board assembly of the wireless LAN card as the example of the card-type wireless communication device of the embodiment. As shown in FIG. 2, the shield case 26 is provided over substantially the whole of the printed board 21 in the width direction so as to cover the whole of the RF circuit part 24. The metal conductor 27 is also provided over substantially the whole of the shield case 26 in the width direction. By this, the top cover 12 made of metal and the shield case 26 are electrically connected to each other over the wide range through the metal conductor 27. Since the leg part of the shield case 26 is connected to the ground pattern of the printed board 21 by soldering, the top cover 12 is connected to the ground potential through the metal conductor 27.

Figure 3:
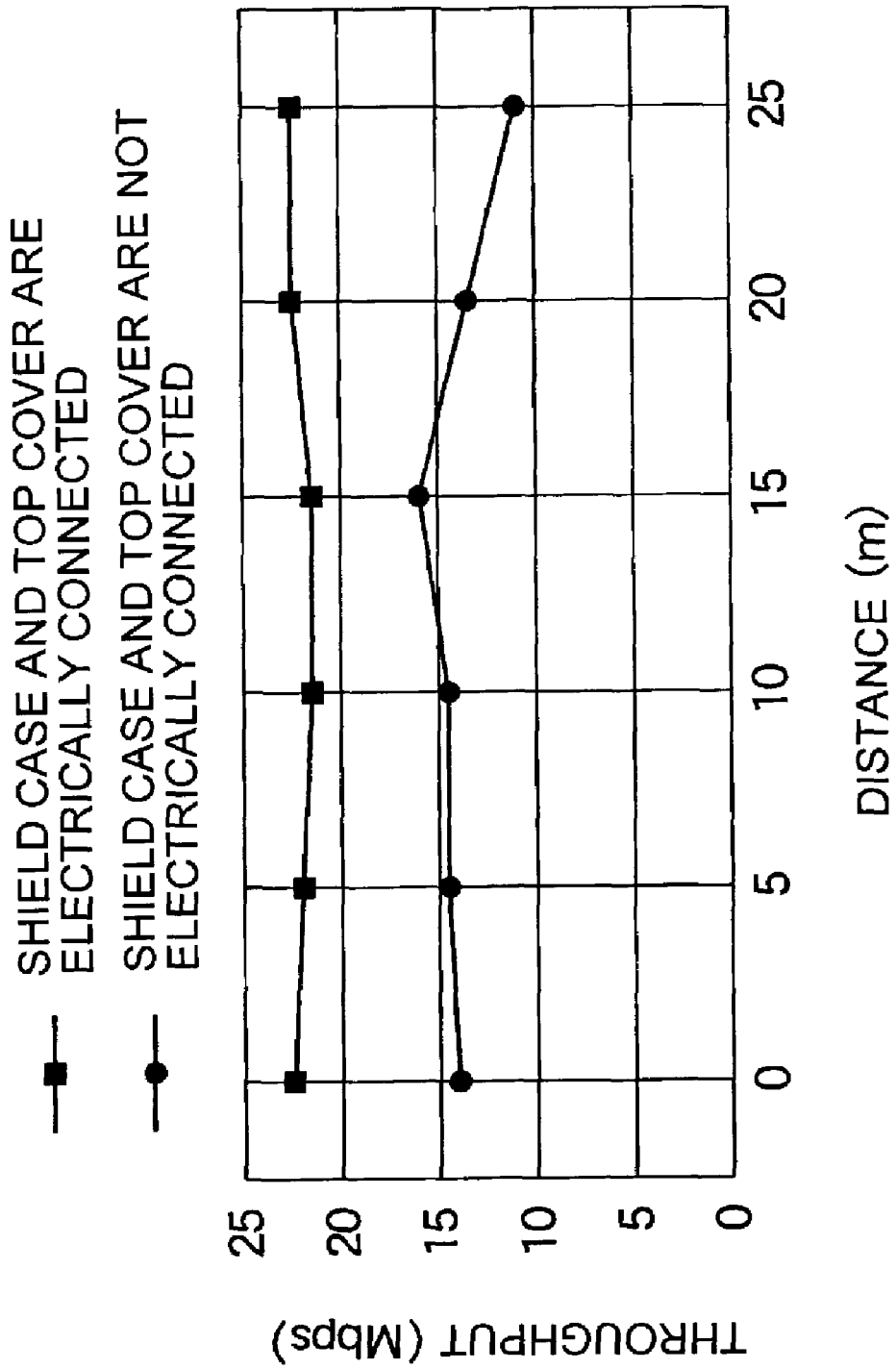
FIG. 3 is a graph showing measurement results of throughput of the wireless LAN card as the card-type wireless communication device according to the embodiment of the invention.
Figure 4:
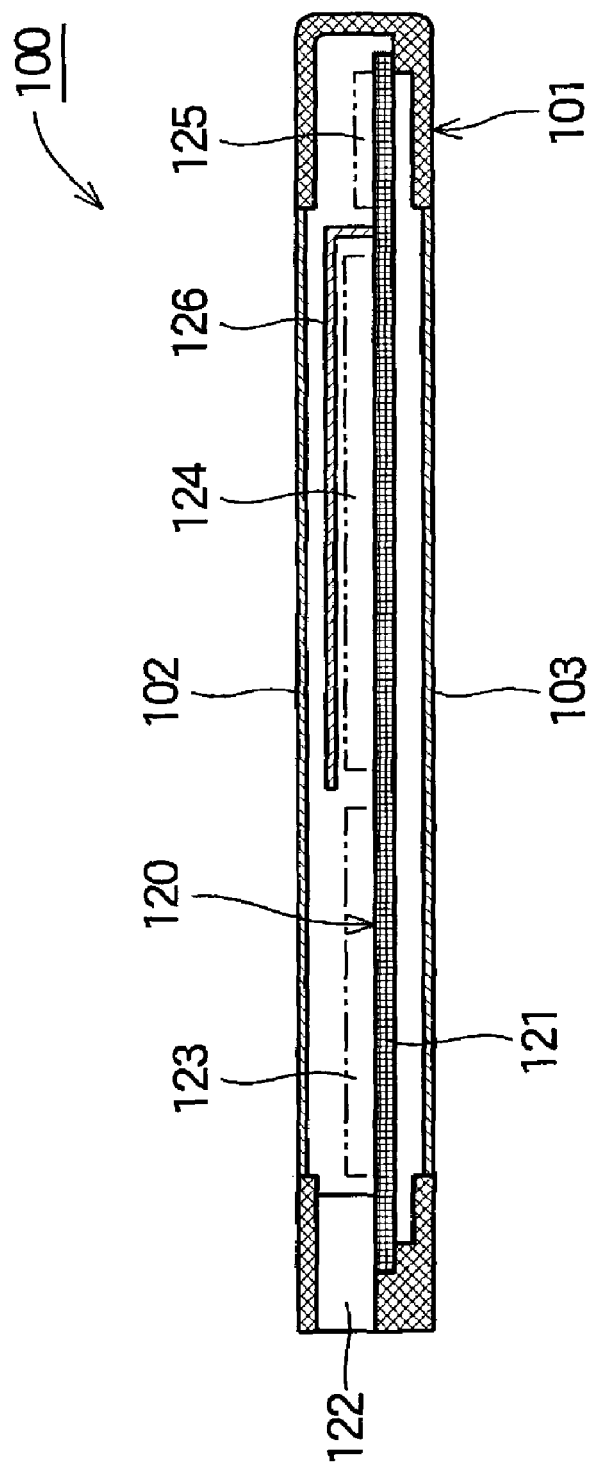
FIG. 4 is a vertical sectional view of a conventional wireless LAN card.
Figure 5:
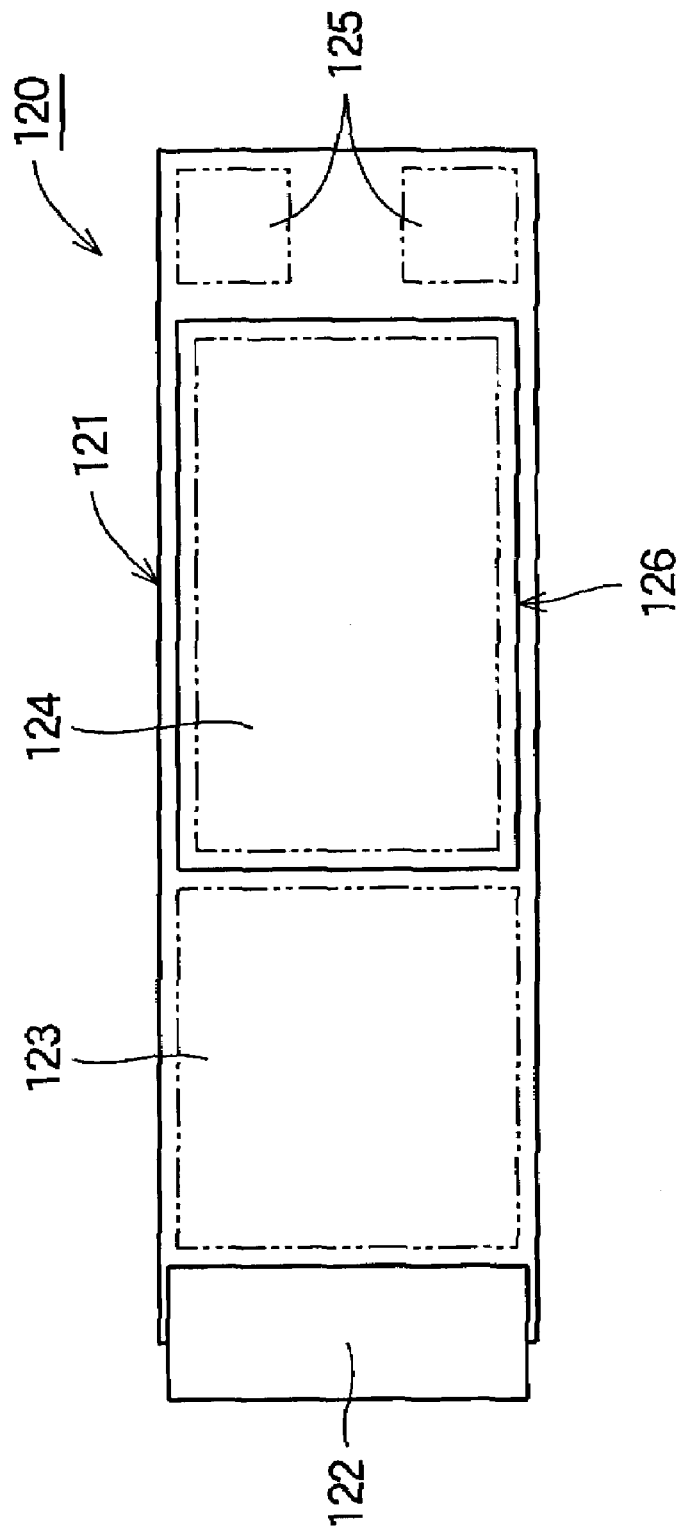
FIG. 5 is a plan view of a printed board assembly of the conventional wireless LAN card.

FIG. 3 is a graph showing measurement results of the throughput of the wireless LAN card as the example of the card-type wireless communication device according to the embodiment. The horizontal axis indicates a distance between a wireless LAN card and a wireless access point or another information terminal device in which a wireless LAN card is mounted. The vertical axis indicates throughput of data transmission when file transfer is performed through the wireless LAN card, and its unit is Mbps. A characteristic indicated by black circular marks is a characteristic of the conventional wireless LAN card in which the shield case and the top cover are put in an electrical non-contact state. A characteristic indicated by square marks is a characteristic of the wireless LAN card of this embodiment. In the case where the conventional wireless LAN card is used, the throughput of the data transmission is about 15 Mbps, whereas in the wireless LAN card of this embodiment in which the shield case 26 and the top cover 12 are connected in the wide range through the metal conductor 27, the throughput is improved to be a value exceeding 20 Mbps.

Besides, it has been found that the structure of the invention improves the throughput of the wireless data transmission more than a structure in which the metal conductor is directly disposed on the ground pattern of the baseband circuit part 23 of the printed board 21 and is brought into direct contact with the top cover 12.

Since the wireless LAN card of this embodiment uses the metal conductor 27 worked into the shape having the elasticity, the shield case 26 and the top cover 12 can be certainly brought into contact with each other. Besides, since heat generation from the RF circuit part 24 can be released to the outside through the shield case 26—the metal conductor 27—the top case 12, a temperature characteristic can be made to have a margin.

The invention is not limited to the above embodiment, but can be modified variously.

For example, in the above embodiment, although the metal conductor 27 having the crooked section is used, the invention is not limited to this, and a metal conductor having, for example, a Z-shaped section (folded in three) or a twice-folded section can also be used.

As described above, since the card-type wireless communication device of the invention has the structure in which the shield case covering the RF circuit part and the metal cover are brought into contact in the wide range through the metal conductor worked into the shape having the elasticity, the sending or receiving of radio data is satisfactorily performed, and the throughput of the wireless data transmission can be improved.

What is claimed is:

1. A card-type wireless communication device comprising:
   a printed board assembly including an antenna part, a radio frequency circuit part, a baseband circuit part, a connector to be connected to an information terminal device, and a metal shield case covering the radio frequency circuit part and electrically connected to a ground pattern;

a metal cover covering the printed board assembly except for the antenna part; and a metal conductor disposed in a gap between the shield case and the metal cover and worked into a shape having elasticity to bring the shield case into contact with the metal cover.

2. A card-type wireless communication device according to claim 1, wherein the metal conductor has a plane shape and is in plane contact with the shield case and the metal cover.

3. A card-type wireless communication device according to claim 1, wherein a surface of the metal conductor is subjected to a treatment to resist oxidation and corrosion.

4. A card-type wireless communication device according to claim 1, wherein a frequency of a radio signal sending or receiving by the antenna part is in a 5 GHz band.

* * * * *